United States Patent
Banda et al.

(10) Patent No.: US 9,358,702 B2
(45) Date of Patent: Jun. 7, 2016

(54) TEMPERATURE MANAGEMENT OF ALUMINIUM NITRIDE ELECTROSTATIC CHUCK

(71) Applicant: Applied Materials, Inc., Santa Clara, CA (US)

(72) Inventors: Sumanth Banda, San Jose, CA (US); Jennifer Y. Sun, Mountain View, CA (US); Douglas A Buchberger, Jr., Livermore, CA (US); Shane C. Nevil, Livermore, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 14/139,116

(22) Filed: Dec. 23, 2013

(65) Prior Publication Data

US 2014/0203526 A1 Jul. 24, 2014

Related U.S. Application Data

(60) Provisional application No. 61/754,346, filed on Jan. 18, 2013.

(51) Int. Cl.
| | | |
|---|---|---|
| *B23Q 3/06* | (2006.01) | |
| *B28D 5/00* | (2006.01) | |
| *H01L 21/67* | (2006.01) | |
| *H01L 21/683* | (2006.01) | |
| *H01L 21/687* | (2006.01) | |

(52) U.S. Cl.
CPC ........ *B28D 5/0082* (2013.01); *H01L 21/67103* (2013.01); *H01L 21/6831* (2013.01); *H01L 21/6875* (2013.01); *H01L 21/68757* (2013.01); *Y10T 29/49826* (2015.01); *Y10T 279/23* (2015.01)

(58) Field of Classification Search
None
See application file for complete search history.

(56) References Cited

U.S. PATENT DOCUMENTS

| 4,439,248 A | 3/1984 | Herchenroeder et al. |
|---|---|---|
| 5,160,152 A * | 11/1992 | Toraguchi et al. ............ 279/128 |

(Continued)

FOREIGN PATENT DOCUMENTS

| JP | 2000306986 A | 11/2000 |
|---|---|---|
| JP | 2001308075 A | 11/2001 |

(Continued)

OTHER PUBLICATIONS

Taffner et al., "Preparation and Microstructural Analysis of High-Performance Ceramics," ASM Handbook vol. 9: Metallography and Microstructures, 2004, 11 pages, ASM International, Materials Park, Ohio, USA.

(Continued)

*Primary Examiner* — Vera Katz
(74) *Attorney, Agent, or Firm* — Lowenstein Sandler LLP (57) ABSTRACT

An unseasoned substrate support assembly includes a ceramic body and a thermally conductive base bonded to a lower surface of the ceramic body. The substrate support assembly further includes an upper surface of the ceramic body having a first portion proximate to a center of the upper surface of the ceramic body and having a first roughness profile and a second portion distal from the center of the upper surface of the ceramic body and having a second roughness profile with a lower roughness than the first roughness profile, wherein areas of the first and second portions are based on radial distances from the center of the ceramic body.

16 Claims, 8 Drawing Sheets

(56) References Cited

U.S. PATENT DOCUMENTS

| | | | |
|---|---|---|---|
| 5,381,944 A | 1/1995 | Makowiecki et al. | |
| 5,548,470 A | 8/1996 | Husain et al. | |
| 5,631,803 A | 5/1997 | Cameron et al. | |
| 5,800,871 A | 9/1998 | Collins et al. | |
| 5,916,689 A | 6/1999 | Collins et al. | |
| 6,028,762 A * | 2/2000 | Kamitani | 361/234 |
| 6,063,203 A | 5/2000 | Satoh | |
| 6,194,083 B1 | 2/2001 | Yasuda et al. | |
| 6,245,202 B1 | 6/2001 | Edamura et al. | |
| 6,361,645 B1 | 3/2002 | Schoepp et al. | |
| 6,506,254 B1 | 1/2003 | Bosch et al. | |
| 6,534,194 B2 | 3/2003 | Weihs et al. | |
| 6,581,275 B2 | 6/2003 | Narendrnath et al. | |
| 6,616,031 B2 | 9/2003 | Wong et al. | |
| 6,805,952 B2 | 10/2004 | Chang et al. | |
| 6,933,254 B2 | 8/2005 | Morita et al. | |
| 6,942,929 B2 | 9/2005 | Han et al. | |
| 7,441,688 B2 | 10/2008 | Van Heerden et al. | |
| 7,615,133 B2 | 11/2009 | Tateno et al. | |
| 7,649,729 B2 | 1/2010 | Buchberger, Jr. et al. | |
| 7,690,308 B2 | 4/2010 | Nielson et al. | |
| 7,696,117 B2 | 4/2010 | Sun et al. | |
| 7,718,007 B2 | 5/2010 | Oohashi et al. | |
| 7,810,704 B2 | 10/2010 | Duckham et al. | |
| 7,964,517 B2 | 6/2011 | Jaiswal | |
| 8,034,734 B2 | 10/2011 | Sun et al. | |
| 8,075,729 B2 | 12/2011 | Holland et al. | |
| 8,206,829 B2 | 6/2012 | Sun et al. | |
| 8,404,572 B2 | 3/2013 | Chang et al. | |
| 2003/0007308 A1 | 1/2003 | Harada et al. | |
| 2003/0047802 A1 | 3/2003 | Hiramatsu et al. | |
| 2004/0187787 A1 | 9/2004 | Dawson et al. | |
| 2005/0266682 A1 | 12/2005 | Chen et al. | |
| 2006/0164785 A1 | 7/2006 | Pellegrin | |
| 2007/0047170 A1 | 3/2007 | Sun et al. | |
| 2007/0212567 A1 | 9/2007 | Esaki et al. | |
| 2008/0016684 A1 | 1/2008 | Olechnowicz et al. | |
| 2008/0029032 A1 | 2/2008 | Sun et al. | |
| 2008/0174930 A1 | 7/2008 | Hattori et al. | |
| 2008/0264564 A1 | 10/2008 | Sun et al. | |
| 2008/0264565 A1 | 10/2008 | Sun et al. | |
| 2008/0268645 A1 | 10/2008 | Kao et al. | |
| 2009/0034147 A1 | 2/2009 | Narendrnath et al. | |
| 2009/0034148 A1 | 2/2009 | Lubomirsky et al. | |
| 2009/0034149 A1 | 2/2009 | Lubomirsky et al. | |
| 2009/0036292 A1 | 2/2009 | Sun et al. | |
| 2009/0214825 A1 | 8/2009 | Sun et al. | |
| 2009/0284894 A1 | 11/2009 | Cooke | |
| 2010/0053841 A1 | 3/2010 | Rusinko, Jr. et al. | |
| 2010/0116788 A1 | 5/2010 | Singh et al. | |
| 2010/0119843 A1 | 5/2010 | Sun et al. | |
| 2010/0177454 A1 | 7/2010 | Elliot et al. | |
| 2010/0314356 A1 | 12/2010 | Nagayama et al. | |
| 2011/0049729 A1 | 3/2011 | Naundorf et al. | |
| 2011/0149462 A1 | 6/2011 | Kugimoto et al. | |
| 2011/0174441 A1 | 7/2011 | Yamashita et al. | |
| 2012/0034469 A1 | 2/2012 | Sun et al. | |
| 2012/0076574 A1 | 3/2012 | Parkhe | |
| 2012/0104703 A1 | 5/2012 | Sun et al. | |
| 2012/0141661 A1 | 6/2012 | Cho et al. | |
| 2012/0299253 A1 | 11/2012 | Kosakai et al. | |
| 2012/0307412 A1 | 12/2012 | Boyd, Jr. et al. | |
| 2013/0019797 A1 | 1/2013 | Tanaka et al. | |
| 2013/0026720 A1 | 1/2013 | Hori et al. | |
| 2013/0224675 A1 | 8/2013 | Park | |

FOREIGN PATENT DOCUMENTS

| | | |
|---|---|---|
| JP | 2006216224 A | 8/2006 |
| JP | 2008016709 A | 1/2008 |
| WO | WO0124581 | 4/2001 |
| WO | WO03100843 | 12/2003 |
| WO | WO2005027203 A2 | 3/2005 |

OTHER PUBLICATIONS

Bhatia et al., "Mechanisms of ceramic coating deposition in solution-precurosr plasma spray," J.Mater. Res., vol. 17, No. 9, Sep. 2002, 10 pages, Materials Research Society, Warrendale, PA, USA.

Di Girolamo et al., "Microstructure and thermal properties of plasma-sprayed ceramic thermal barrier coatings," Energia, Ambiente e Innovazione, Published Jan. 2, 2013.

Bergant et al., "Porosity evaluation of flame-sprayed and heat-treated coatings using image analysis," Image Anal Stereol 2011;30:53-62, Published Jan. 27, 2011.

International Search Report & Written Opinion of the International Searching Authority dated Jun. 2, 2014, in International Application No. PCT/US2014/010561.

Haas et al., "Gas jet assisted vapor deposition of yttria stabilized zirconia," Department of Materials Science and Engineering, School of Engineering and Applied Science, published Feb. 27, 2009 University of Virginia, Charlottesville, Virginia 22903.

* cited by examiner

TEMPERATURE MANAGEMENT OF ALUMINIUM NITRIDE ELECTROSTATIC CHUCK

RELATED APPLICATIONS

This patent application claims the benefit under 35 U.S.C. §119(e) of U.S. Provisional Application No. 61/754,346, filed Jan. 18, 2013.

TECHNICAL FIELD

Embodiments of the present invention relate, in general, to a substrate support assembly such as an electrostatic chuck that has a ceramic body with multiple portions, wherein each portion has a distinct surface roughness profile.

BACKGROUND

In the semiconductor industry, devices are fabricated by a number of manufacturing processes producing structures of an ever-decreasing size. Some manufacturing processes such as plasma etch and plasma clean processes expose a substrate to a high-speed stream of plasma to etch or clean the substrate. The plasma may be highly corrosive, and may corrode processing chambers and other surfaces that are exposed to the plasma. This corrosion may generate particles, which frequently contaminate the substrate that is being processed, contributing to device defects.

Traditional electrostatic chucks are manufactured by a multi-step manufacturing process which may include a silicone bond of a ceramic puck to a metal cooling plate. The silicone bonding process of the ceramic puck to the metal cooling plate can introduce carbon and other contaminants on the surface of the ceramic puck, which may affect the temperature distribution properties of the ceramic puck. When high power recipes or operating procedures are run using such traditional electrostatic chucks, the edge of the electrostatic chuck may exhibit substantially higher temperatures as compared to the center of the electrostatic chuck.

SUMMARY

In one embodiment, a substrate support assembly comprises a ceramic body and a thermally conductive base bonded to a lower surface of the ceramic body. An upper surface of the ceramic body has a first portion proximate to a center of the ceramic body and having a first roughness profile and a second portion distal from the center of the ceramic body and having a second roughness profile. Areas of the first and second portions are based on their respective radial distance from the center of the ceramic body. Oxygen ashing may have been performed to remove carbon contaminants from the upper surface of the ceramic body.

BRIEF DESCRIPTION OF THE DRAWINGS

The present invention is illustrated by way of example, and not by way of limitation, in the figures of the accompanying drawings in which like references indicate similar elements. It should be noted that different references to "an" or "one" embodiment in this disclosure are not necessarily to the same embodiment, and such references mean at least one.

DETAILED DESCRIPTION OF EMBODIMENTS

Embodiments of the present invention provide a substrate support assembly (e.g., an electrostatic chuck) having a ceramic body, a thermally conductive base bonded to a lower surface of the ceramic body, and an upper surface of the ceramic body having a polished first portion near the center of the ceramic body with a first roughness profile and a polished second portion further from the center of the ceramic body (e.g., near the edge of the ceramic body) with a second roughness profile. Areas of the first and second portions may be based on radial distances from the center of the ceramic body. The second portion may have a lower surface roughness than the first portion. The polished first and second portions may improve thermal contact between the ceramic body and the thermally conductive base. In a further embodiment, oxygen ($O_2$) ashing is performed on the substrate support assembly to remove carbon contaminants from the upper surface of the ceramic body. The $O_2$ ashing may further improve the thermal contact between the ceramic body and the thermally conductive base. The improved thermal contact may cause a temperature of the substrate support assembly to be reduced during processing and provide a more consistent temperature distribution across substrates supported by the substrate support assembly.

Figure 1:
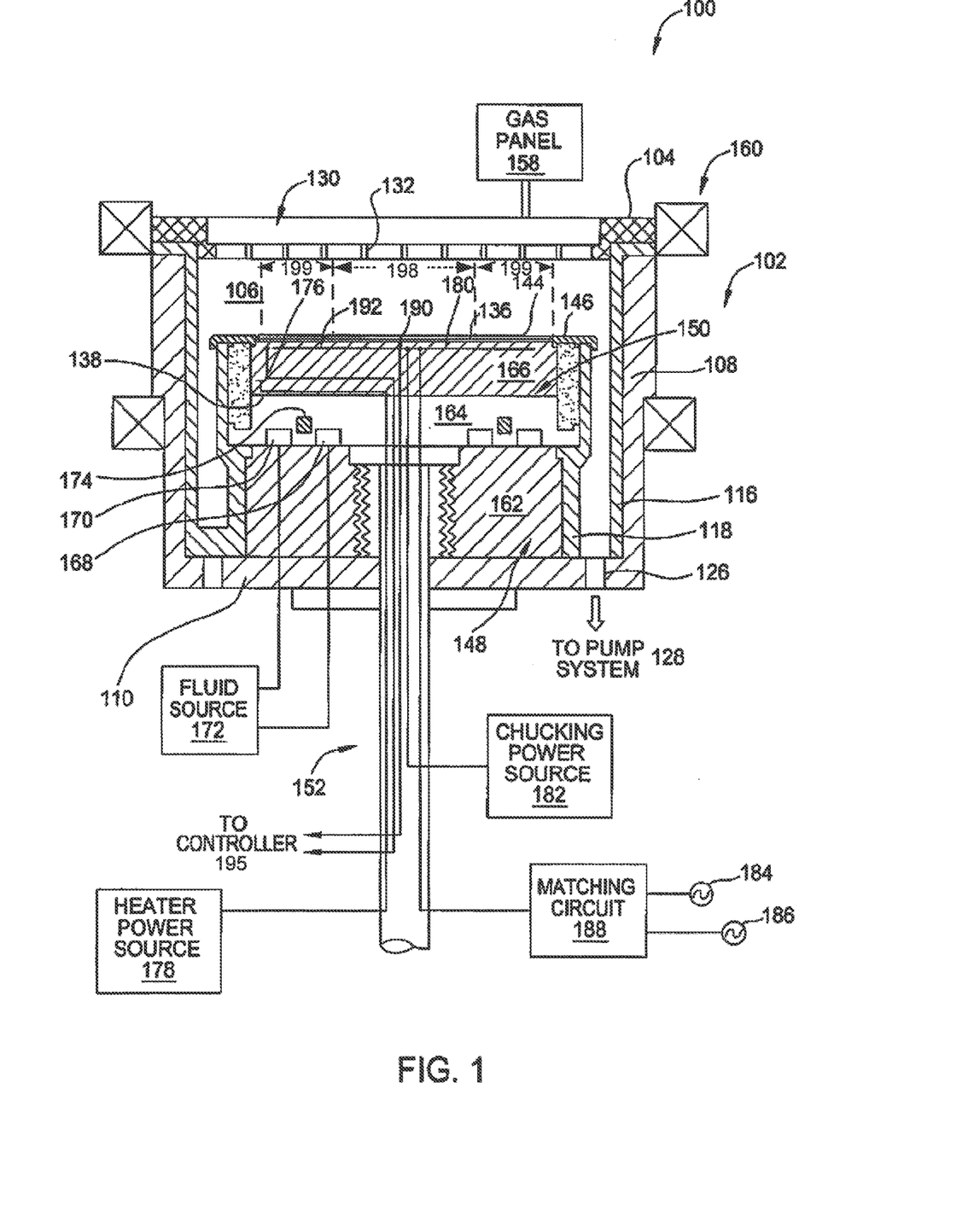
FIG. 1 depicts a sectional view of one embodiment of a processing chamber.

FIG. 1 is a sectional view of one embodiment of a semiconductor processing chamber 100 having a substrate support assembly 148 disposed therein. The substrate support assembly 148 in the illustrated embodiment has a protective layer 136, which may be a plasma resistant ceramic such as MN (Aluminum Nitride), $Al_2O_3$ (Aluminum Oxide), $Y_2O_3$ (Yttria), $Y_4Al_2O_9$ (YAM), a yttrium alloy or an oxide thereof. In one embodiment, the protective layer is a high performance material (HPM) ceramic composite. The protective layer 136 may be a sintered bulk ceramic article that was produced from a ceramic powder or a mixture of ceramic powders. Alternatively, the protective layer 136 may be a plasma sprayed or thermally sprayed layer that was produced by plasma spraying (or thermally spraying) a mixture of ceramic powders. Alternatively, the protective layer 136 may be an ion assisted deposition (IAD) coating that was deposited using a bulk HPM target. Alternatively, the substrate support assembly 148 may not include a protective layer.

The HPM ceramic composite is composed of a compound of $Y_4Al_2O_9$ (YAM) and a solid solution of $Y_2\text{-}xZr_xO_3$ ($Y_2O_3$—$ZrO_2$ solid solution). In one embodiment, the HPM ceramic composite contains 77% $Y_2O_3$, 15% $ZrO_2$ and 8% $Al_2O_3$. In another embodiment, the HPM ceramic composite contains 63% $Y_2O_3$, 23% $ZrO_2$ and 14% $Al_2O_3$. In still another embodiment, the HPM ceramic composite contains 55% $Y_2O_3$, 20% $ZrO_2$ and 25% $Al_2O_3$. Relative percentages may be in molar ratios. For example, the HPM ceramic composite may contain 77 mol % $Y_2O_3$, 15 mol % $ZrO_2$ and 8 mol % $Al_2O_3$. Other distributions of these ceramic powders may also be used for the HPM material.

The processing chamber 100 includes a chamber body 102 and a lid 104 that enclose an interior volume 106. The chamber body 102 may be fabricated from aluminum, stainless steel or other suitable material. The chamber body 102 generally includes sidewalls 108 and a bottom 110. An outer liner 116 may be disposed adjacent the sidewalls 108 to protect the chamber body 102. The outer liner 116 may be fabricated and/or coated with a plasma or halogen-containing gas resistant material. In one embodiment, the outer liner 116 is fabricated from aluminum oxide. In another embodiment, the outer liner 116 is fabricated from or coated with yttria, yttrium alloy or an oxide thereof.

An exhaust port 126 may be defined in the chamber body 102, and may couple the interior volume 106 to a pump system 128. The pump system 128 may include one or more pumps and throttle valves utilized to evacuate and regulate the pressure of the interior volume 106 of the processing chamber 100.

The lid 104 may be supported on the sidewall 108 of the chamber body 102. The lid 104 may be opened to allow excess to the interior volume 106 of the processing chamber 100, and may provide a seal for the processing chamber 100 while closed. A gas panel 158 may be coupled to the processing chamber 100 to provide process and/or cleaning gases to the interior volume 106 through a gas distribution assembly 130 that is part of the lid 104. Examples of processing gases may be used to process in the processing chamber including halogen-containing gas, such as $C_2F_6$, $SF_6$, $SiCl_4$, HBr, $NF_3$, $CF_4$, $CHF_3$, $CH_2F_3$, $Cl_2$ and $SiF_4$, among others, and other gases such as $O_2$, or $N_2O$. Examples of carrier gases include $N_2$, He, Ar, and other gases inert to process gases (e.g., non-reactive gases). The gas distribution assembly 130 may have multiple apertures 132 on the downstream surface of the gas distribution assembly 130 to direct the gas flow to the surface of the substrate 144. Additionally, the gas distribution assembly 130 can have a center hole where gases are fed through a ceramic gas nozzle. The gas distribution assembly 130 may be fabricated and/or coated by a ceramic material, such as silicon carbide, yttria, etc. to provide resistance to halogen-containing chemistries to prevent the gas distribution assembly 130 from corrosion.

The substrate support assembly 148 is disposed in the interior volume 106 of the processing chamber 100 below the gas distribution assembly 130. The substrate support assembly 148 holds the substrate 144 during processing. An inner liner 118 may be coated on the periphery of the substrate support assembly 148. The inner liner 118 may be a halogen-containing gas resist material such as those discussed with reference to the outer liner 116. In one embodiment, the inner liner 118 may be fabricated from the same materials of the outer liner 116.

In one embodiment, the substrate support assembly 148 includes a mounting plate 162 supporting a pedestal 152, and an electrostatic chuck 150. The electrostatic chuck 150 further includes a thermally conductive base 164 and a ceramic body (referred to as an electrostatic puck 166). The electrostatic puck 166 may be fabricated by a ceramic material such as aluminum nitride (AlN) or aluminum oxide ($Al_2O_3$). An upper surface of the electrostatic puck 166 may or may not be covered by the protective layer 136. In one embodiment, the protective layer 136 is disposed on the upper surface of the electrostatic puck 166. In another embodiment, the protective layer 136 is disposed on the entire surface of the electrostatic chuck 150 including the outer and side periphery of the thermally conductive base 164 and the electrostatic puck 166. Alternatively, there may be no protective layer 136.

An upper surface of the electrostatic puck 166 may include multiple different portions or regions, each having different and distinct surface roughness profiles. If the electrostatic puck 166 is covered by the protective layer 136, then the protective layer may include multiple different portions or regions, each having different surface roughness profiles. A first portion 198 that is close to a center of an upper surface of the electrostatic puck 166 may have been polished to a first roughness, and a second portion 199 that is distal to the center of the upper surface may have been polished to a second lower roughness than the first roughness.

The mounting plate 162 is coupled to the bottom 110 of the chamber body 102 and includes passages for routing utilities (e.g., fluids, power lines, sensor leads, etc.) to the thermally conductive base 164 and the electrostatic puck 166.

The thermally conductive base 164 and/or electrostatic puck 166 may include one or more optional embedded heating elements 176, embedded thermal isolators 174 and/or conduits 168, 170 to control a lateral temperature profile of the support assembly 148. The conduits 168, 170 may be fluidly coupled to a fluid source 172 that circulates a temperature regulating fluid through the conduits 168, 170. The embedded isolator 174 may be disposed between the conduits 168, 170 in one embodiment. The heater 176 is regulated by a heater power source 178. The conduits 168, 170 and heater 176 may be utilized to control the temperature of the thermally conductive base 164, thereby heating and/or cooling the electrostatic puck 166 and a substrate (e.g., a wafer) being processed. The temperature of the electrostatic puck 166 and the thermally conductive base 164 may be monitored using a plurality of temperature sensors 190, 192, which may be monitored using a controller 195.

The electrostatic puck 166 may further include multiple gas passages such as grooves, mesas and other surface features, that may be formed in an upper surface of the puck 166 and/or the protective layer. The grooves, mesas and/or other surface features may have been formed prior to the surface of the electrostatic puck 166 being polished. Accordingly, the polishing may have polished the mesas and/or other surface features in one embodiment. The gas passages may be fluidly coupled to a source of a heat transfer (or backside) gas, such as He via holes drilled in the puck 166. In operation, the backside gas may be provided at controlled pressure into the gas passages to enhance the heat transfer between the electrostatic puck 166 and the substrate 144.

The electrostatic puck 166 includes at least one clamping electrode 180 controlled by a chucking power source 182. The electrode 180 (or other electrode disposed in the puck 166 or base 164) may further be coupled to one or more RF power sources 184, 186 through a matching circuit 188 for maintaining a plasma formed from process and/or other gases within the processing chamber 100. The sources 184, 186 are generally capable of producing RF signal having a frequency from about 50 kHz to about 3 GHz and a power of up to about 10,000 Watts.

Figure 2:
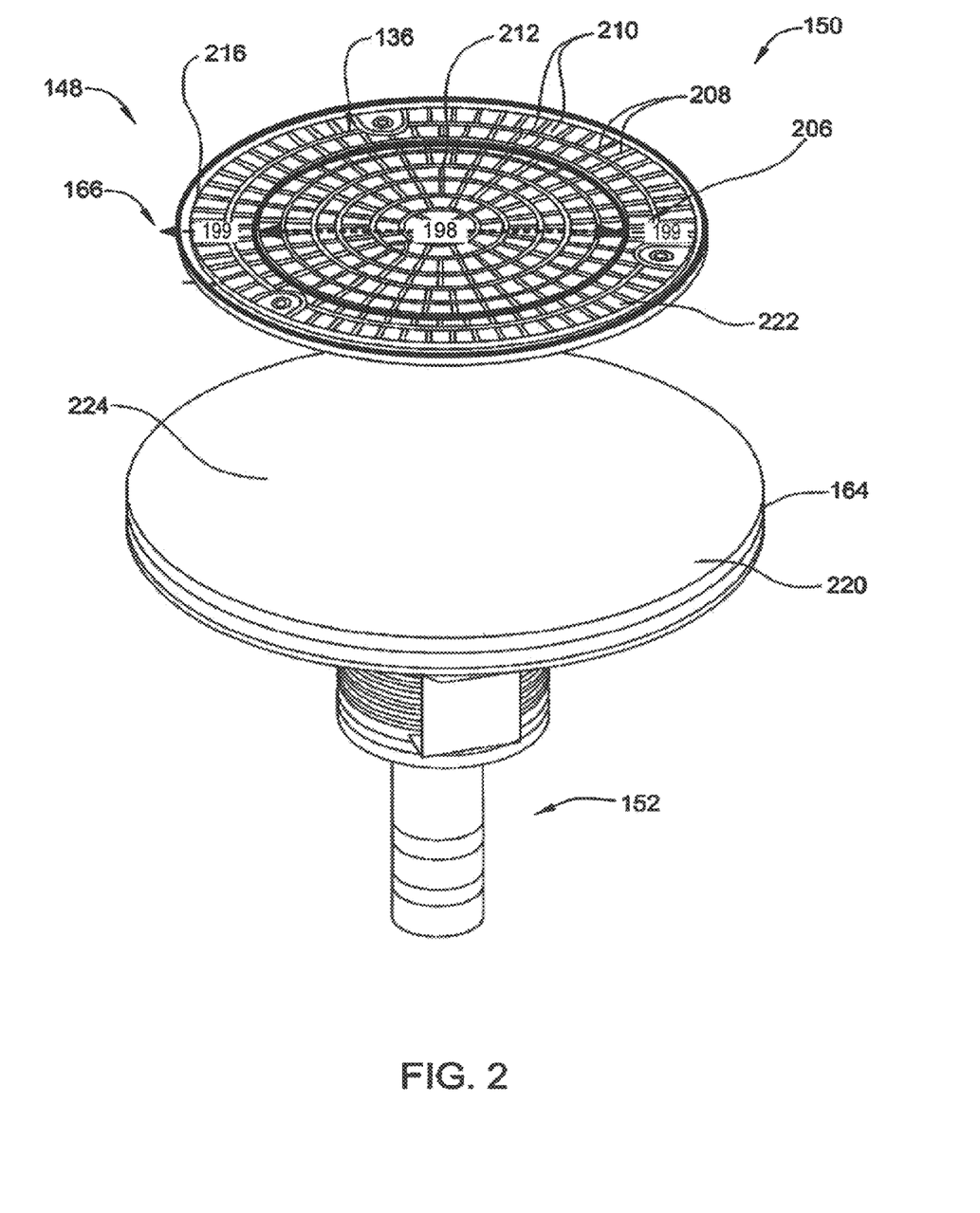
FIG. 2 depicts an exploded view of one embodiment of a substrate support assembly.

FIG. 2 depicts an exploded view of one embodiment of the substrate support assembly 148. The substrate support assembly 148 depicts an exploded view of the electrostatic chuck 150 and the pedestal 152. The electrostatic chuck 150 includes the electrostatic puck 166 and the thermally conductive base 164 attached to the electrostatic puck 166. The electrostatic puck 166 has a disc-like shape having an annular periphery 222 that may substantially match the shape and size of the substrate 144 positioned thereon. An upper surface 206 of the electrostatic puck 166 may have an outer ring 216, multiple mesas 210 and channels 208, 212 between the mesas. As shown, the electrostatic puck 166 may include a first portion 198 and a second portion 199. An area of the first portion 198 may extend from a center of the electrostatic puck's upper surface to a first radius. An area of the second portion 199 may extend from the second radius to the annular periphery 222 of the electrostatic puck 166. The first portion (e.g., tops of the mesas in the first portion) may be polished to a first roughness, while the second portion (e.g., tops of the mesas in the second portion) may be polished to a second roughness.

The thermally conductive base 164 attached below the electrostatic puck 166 may have a disc-like main portion 224 and an annular flange 220 extending outwardly from a main portion 224 and positioned on the pedestal 152. The thermally conductive base 164 may be fabricated by a material having thermal properties substantially matching that of the overlying puck 166. In one embodiment, the thermally conductive base 164 may be fabricated by a metal, such as aluminum or stainless steel or other suitable materials. Alternatively, the thermally conductive base 164 may be fabricated by a composite of ceramic and metal material providing good strength and durability as well as heat transfer properties. The composite material may have a thermal expansion coefficient that is substantially matched to the overlying puck 166 to reduce thermal expansion mismatch.

Figure 3:
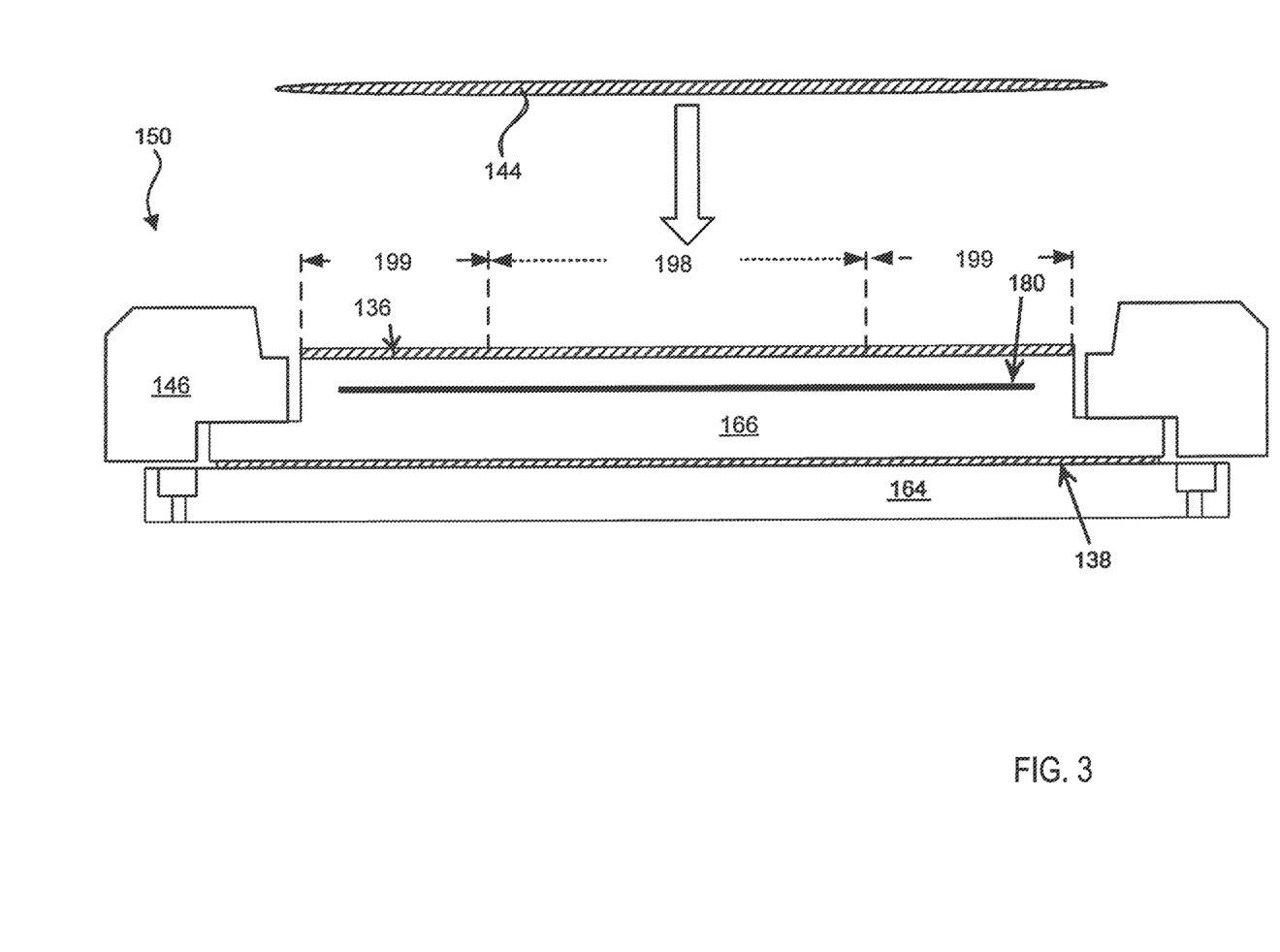
FIG. 3 depicts a side view of one embodiment of a substrate support assembly.

FIG. 3 illustrates a cross sectional side view of one embodiment of the electrostatic chuck 150. Referring to FIG. 3, the thermally conductive base 164 is coupled to the electrostatic puck 166 by a bonding material 138. The bonding material 138 facilitates thermal energy exchange between the electrostatic puck 166 and the thermally conductive base 164 and may reduce thermal expansion mismatch therebetween. In one exemplary embodiment, the bonding material 138 mechanically bonds the thermally conductive base 164 to the electrostatic puck 166. In another embodiment, the bonding material 138 may be a thermal conductive paste or tape having at least one of an acrylic based compound and silicone based compound. In yet another embodiment, the bonding material 138 may be a thermal conductive paste or tape having at least one of an acrylic based compound and silicone based compound with metal or ceramic fillers mixed or added thereto. The metal filler may be at least one of Al, Mg, Ta, Ti, or combination thereof and the ceramic filler may be at least one of aluminum oxide ($Al_2O_3$), aluminum nitride (AlN), titanium diboride ($TiB_2$) or combination thereof.

A quartz ring 146, or other protective ring, surrounds and covers portions of the electrostatic chuck 150. The puck 166 includes the clamping electrode 180. In one embodiment, a protective layer 136 adheres to an upper surface of the puck 166. The substrate 144 is lowered down over the electrostatic puck 166, and is held in place via electrostatic forces.

The protective layer 136 may be coated by physical vapor deposition (PVD), chemical vapor deposition (CVD), ion assisted deposition (IAD), immersion coating, sputtering, thermal spraying (e.g., plasma spraying), hot isostatic pressing, cold isostatic pressing, lamination, compression molding, casting, compacting, sintering or co-sintering techniques known in the art. In one embodiment, protective layer is plasma sprayed onto the puck 166. In another embodiment, the protective layer 136 is deposited on the puck 166 using ion assisted deposition (IAD). In still another embodiment, the protective layer 136 is a bulk sintered HPM ceramic composite article that is diffusion bonded to an upper surface of the puck 166. As shown, the electrostatic puck 166 may include a first portion 198 and a second portion 199. An area of the first portion 198 may extend from a center of the electrostatic puck's upper surface to a first radius. An area of the second portion 199 may extend from the second radius to the outer edge of the electrostatic puck 166. The first portion (e.g., tops of the mesas in the first portion) may be polished to a first roughness, while the second portion (e.g., tops of the mesas in the second portion) may be polished to a second roughness.

Figure 4A:
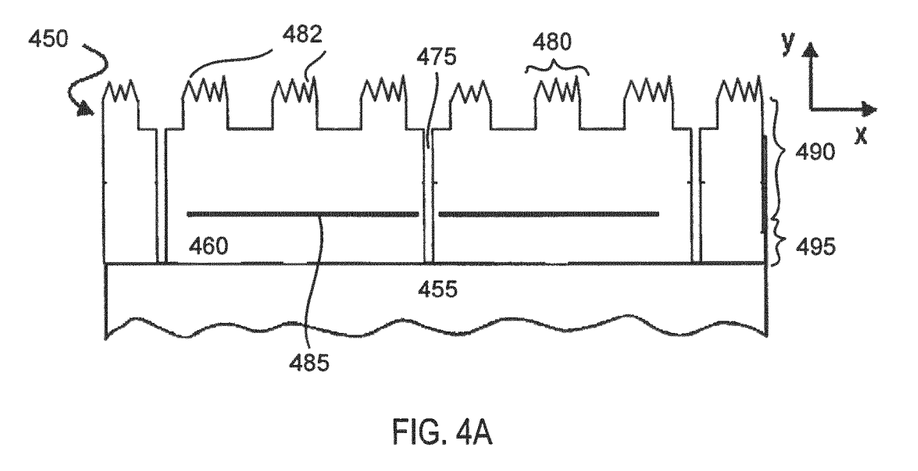
FIG. 4A depicts an exploded side view of one embodiment of a substrate support assembly.

FIG. 4A illustrates a cross sectional side view of one embodiment of an electrostatic chuck 450 prior to performance of a multi-step polishing process. The electrostatic chuck 450 has a ceramic body 460 known as an electrostatic puck. In one embodiment, the ceramic body 460 includes an electrode 485, an upper portion 490 above the electrode 485 and a lower portion 495 below the electrode. The upper portion 490 may have a thickness of greater than approximately 200 microns (e.g., 5 mil in one embodiment). In a further embodiment, the ceramic body 460 has a thickness of between about 200 microns and 500 microns. A lower surface of the ceramic body 460 is bonded to a thermally conductive base 455 (e.g., a metal base) via a bond such as a silicone bond. After the ceramic body 460 is formed, the ceramic body 460 may be cleaned by using, for example, de-ionized water and/or an acetone bath, and holes 475 may also be drilled in the ceramic body 460. The electrostatic chuck 450 can be used both for Johnson-Raybeck electrostatic chucking applications and Columbic electrostatic chucking applications.

Mesas 480 may be formed on an upper surface of the ceramic body 460. The mesas may be formed, for example, by bead blasting or salt blasting the surface of the ceramic body 460. The surface of the mesas 480 may have an average surface roughness 482 of greater than 20 micro-inches throughout the entire surface areas of the mesas 480.

Figure 4B:
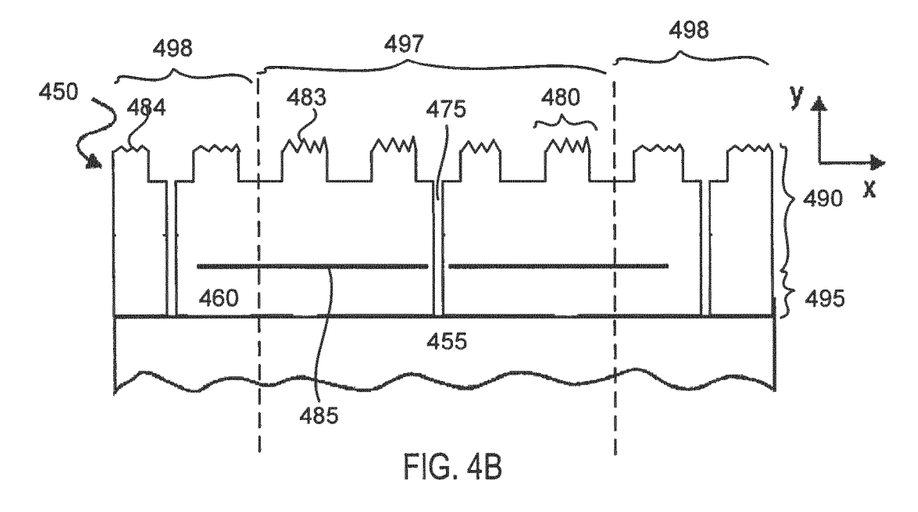
FIG. 4B depicts an exploded side view of another embodiment of a substrate support assembly.

FIG. 4B illustrates a cross sectional side view of one embodiment of an electrostatic chuck 450 after performance of a multi-step polishing process. In one embodiment, the ceramic body 460 is divided into two zones or portions. The first portion 497 is near to the center of the upper surface of the ceramic body 460, while the second portion 498 is distal to the center of the upper surface of the ceramic body 460 (e.g., near the outer edge of the upper surface of the ceramic body 460). In alternative embodiments, the ceramic body 460 may be divided into three or more zones (not shown).

The first portion 497 of the ceramic body 460 may be polished in a first polishing process. The first polishing process may be performed using a first polishing tool such as a grinder and a first polishing slurry (e.g., a slurry having a first grit). In one embodiment, the entire surface of the ceramic body (including the first portion 197 and the second portion 198) are polished in the first polishing process. In such an embodiment, the grinder may have a grinding arm that extends from the outer radius of the ceramic body 460 to the center of the ceramic body. The ceramic body may be rotated about its center as the grinding arm is pressed against the surface of the ceramic body, with the slurry coating the surface of the ceramic body.

After the first polishing process is complete, the ceramic body 460 may be cleaned by using, for example, de-ionized water and/or an acetone bath. In an embodiment, the polishing process for the first portion 497 may reduce the average surface roughness of the first portion 497 from greater than 20 micro-inches to between 10 and 16 micro-inches. The first polishing process may additionally reduce the average surface roughness of the second portion 198 from greater than 20 micro-inches to between 10 and 16 micro-inches.

The second portion 498 of the ceramic body 460 may be polished in a second polishing process. The second polishing process may be performed using a second polishing tool such as a grinder and second polishing slurry (e.g., having a second grit). In one embodiment, the second polishing process polishes the second portion 498 without polishing the first portion 497. In such an embodiment, the grinder may have a grinding arm that extends from the outer radius of the ceramic body 460 to the outer radius of the first portion. The ceramic body may be rotated about its center as the grinding arm is pressed against the surface of the ceramic body at the second portion 498, with the slurry coating the surface of the ceramic body.

In order to achieve a smoother surface for the second portion 498, the second polishing slurry may have a finer grit that the respective first polishing slurry. After the second portion 498 is polished, the ceramic body 460 may be cleaned by using, for example, de-ionized water or an acetone bath. In an embodiment, the polishing process for the second portion 498 may reduce the average surface roughness of the second portion 498 from greater than 20 micro-inches to between 4 and 10 micro-inches. If the second portion 498 was also polished in the first polishing process, then the second portion may be reduced from an average surface roughness of approximately 10-16 micro-inches to an average surface roughness of approximately 4-10 micro-inches.

Note that in an alternative embodiment the ceramic body may be coated with a protective layer. The protective layer may be formed with or without surface features (e.g., mesas) having been formed on the ceramic body. If the protective layer is formed without surface features having been formed in the ceramic body, then the surface features will be formed in the protective layer. In embodiments including the protective layer, the upper surface of the ceramic body may not be polished. Instead, the polishing processes may be performed on the protective layer rather than on the upper surface of the ceramic body.

Figure 5:
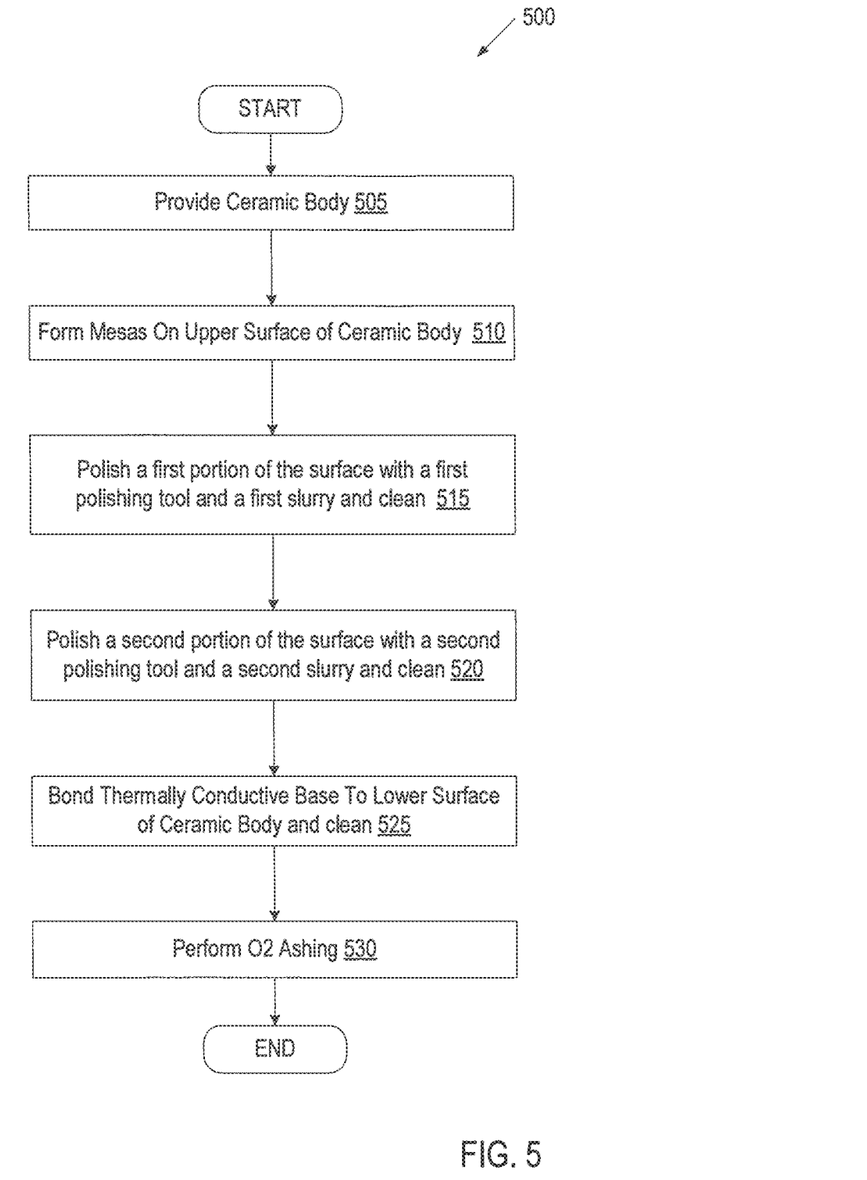
FIG. 5 illustrates one embodiment of a process for forming a ceramic body of a substrate support surface having multiple roughness profiles.

FIG. 5 illustrates one embodiment of a process 500 for manufacturing an electrostatic chuck. At block 505 of process 500, a ceramic body is provided. The ceramic body may be a metalized ceramic puck for an electrostatic chuck. In one embodiment, the ceramic body is an aluminum nitride ceramic body. The ceramic body may contain heating elements, an electrode, cooling channels, and/or other features. At block 510, mesas are formed on an upper surface of the ceramic body.

At block 515, a first portion of the upper surface of the ceramic body is polished using a first polishing tool and a first slurry. The ceramic body may then be cleaned (e.g., using de-ionized water to remove remnants of the first slurry). The first portion is near the center of the surface of the ceramic body, and may extend from the center to a first radius. At block 520, a second portion of the upper surface of the ceramic body is polished using a second polishing tool and a second slurry. The ceramic body may then be cleaned (e.g., to remove remnants of the second slurry). The second portion is near the edge of the ceramic body, and may extend from the first radius of the ceramic body to a second outer radius of the ceramic body.

At block 525, a lower surface of the ceramic body is bonded to a thermally conductive base. The bonding process may form a silicone bond between the ceramic body and the thermally conductive base. The bonding process produces contamination on the surface of the ceramic body. The contamination may include, for example, silicon and carbon contamination. This contamination may reduce a thermal conductivity of the ceramic body at the surface, and may impair a thermal contact between the ceramic body and a held substrate during use of the ceramic body in processing. After the bonding process is complete, the ceramic body 460 may be cleaned by using, for example, de-ionized water and/or an acetone bath.

At block 530, oxygen ashing is performed on the ceramic body. Oxygen ashing, or stripping, is a process that may be used to remove the contamination from the ceramic body. The process of oxygen ashing involves the removal of organic matter from the substrate by applying an oxygen plasma to the ceramic body at a high temperature. Products of the oxygen ashing process include carbon oxides and water vapor, which may be pumped away by a vacuum system. Exposure to the oxygen plasma for a duration of time (e.g., greater than 1 hour) eventually removes organic compounds such as carbon and hydrogen, leaving little residue.

Figure 6:
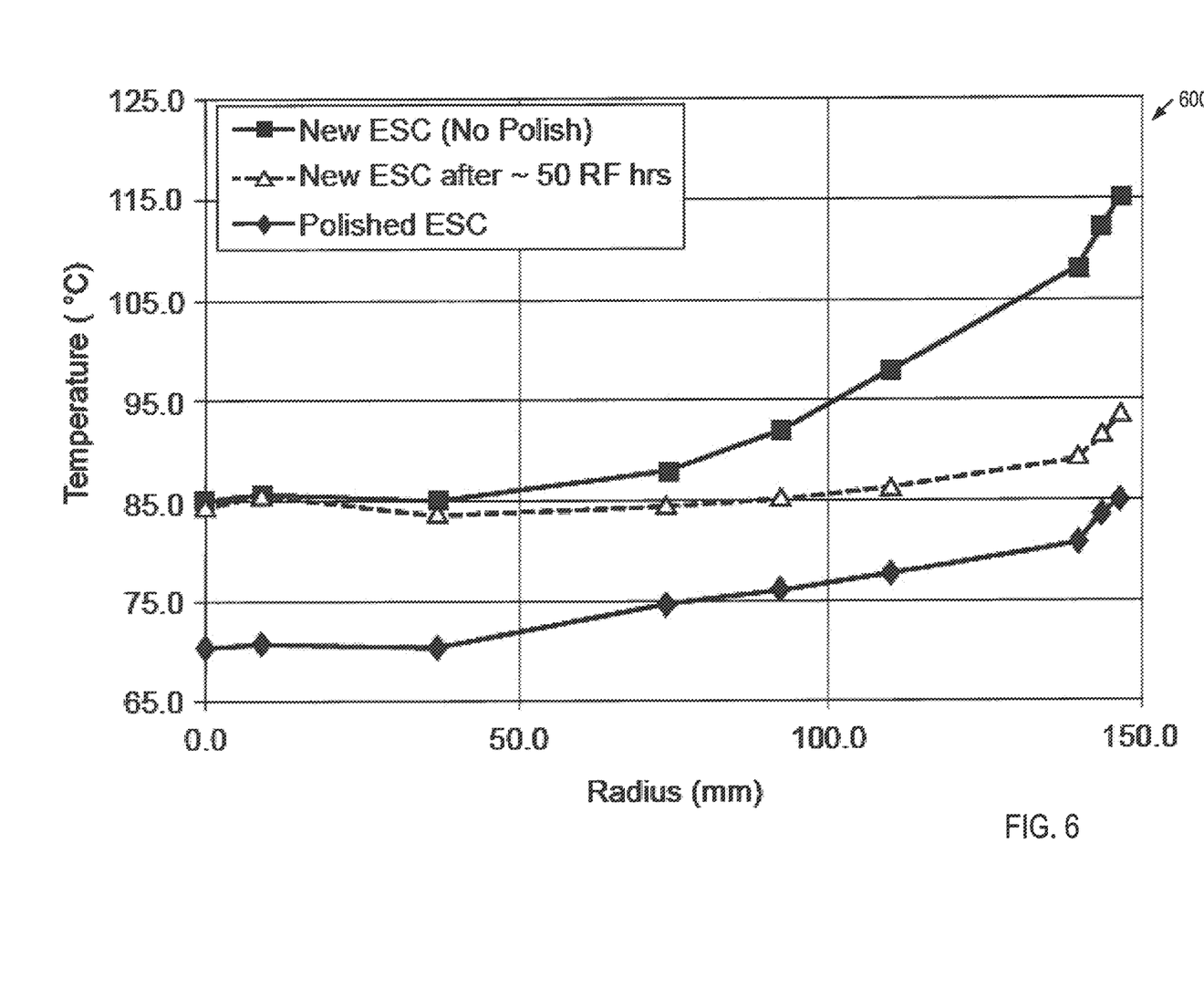
FIG. 6 illustrates temperature data for one embodiment of a substrate support assembly.

FIG. 6 illustrates temperature data for embodiments of a substrate support assembly in accordance with the present disclosure. The graph of FIG. 6 charts the temperature of a ceramic body of an electrostatic chuck (ESC) vs. the radial distance from the center of the ESC after executing a high power recipe or operating procedure on the ESC. FIG. 6 shows the temperature data for: 1) a new ESC without having been polished and without having been subjected to Radio Frequency Hours (RFHrs) e.g., seasoning or cycling time of the ESC; 2) a new ESC without having been polished and having been subjected to approximately 50 RFHrs of processing; and 3) a polished ESC without having been subjected to any or only a few RFHrs of processing (e.g., a new wafer or an unseasoned wafer that has undergone little processing such as less than 20 RFHrs of processing).

When high power procedures are run on a new ESC without having been polished and without having been subjected to approximately 50 RFHrs of processing, the edge of the ceramic body of ESC exhibits very high temperatures (e.g., 115 degrees) as compared to the center of the ESC (e.g., 85 degrees). An unpolished ESC has an average surface roughness of about 20 micro-inches to 26 micro-inches throughout the entire surface area of the ESC. The high edge temperatures and the change in the temperature from the center to the edge are problematic and may adversely affect the service life of the ESC and/or the performance of products produced on supported substrates.

The edge temperature is reduced when using an ESC that has been subjected to approximately 50 RFHrs (e.g., from approximately 115 degrees to less than 95 degrees). The reason for the drop in temperature can be attributed to a gradual smoothing of the ESC that results from the exposure to the approximately 50 RFHrs due to a mismatch in the coefficient of thermal expansion between the ESC and the substrates that it supports.

According to an embodiment of the invention, the polished ESC shows a further improvement in the temperature management of the ESC. For example, as noted above, an unpolished ESC has an average surface roughness of about 20 micro-inches to 26 micro-inches throughout the entire surface area of the ESC. In an embodiment, the center and the edge of the ESC are polished such that the center portion of the ESC (e.g. having a radial distance from approximately 0-140 mm from the center of the ESC) has an average surface roughness of about 10-16 micro-inches, while the edge portion of the ESC (e.g., having a radial distance from approximately 140-150 mm from the center of the ESC) has an average surface roughness of about 4-10 micro-inches. By polishing the center and the edge of the ESC in such fashion, the surface temperature of the ceramic body during high power processes is reduced (e.g., from about 85 degrees to 70 degrees Celsius near the center of the ESC and from about 115 degrees Celsius near the edge of the ESC to about 85 degrees). Additionally, the thermal gradient between the center and the edge of the ESC is much reduced (e.g., about a 15 degree difference between the center and the edge for the polished ESC compared to about a 30 degree difference for the unpolished ESC with no RFHrs of processing).

Figure 7:
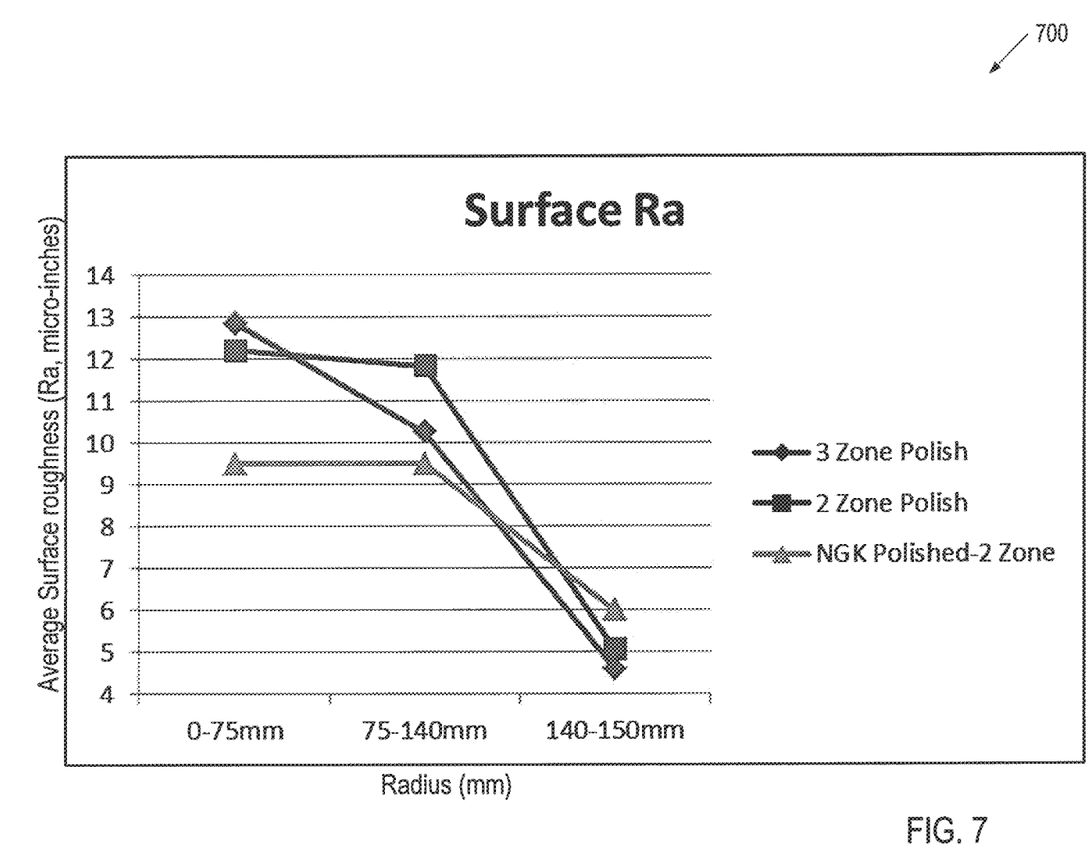
FIG. 7 illustrates surface roughness data for one embodiment of a substrate support assembly.

FIG. 7 illustrates surface roughness data for an embodiment of a substrate support assembly. The graph of FIG. 7 charts the average surface roughness (Ra, in micro-inches) of a ceramic body of an electrostatic chuck (ESC) vs. the radial distance from the center of the ESC. For example, for an ESC with a 3 zone polish, the Ra from 0-75 mm from the center is about 13 micro-inches, from 75-140 mm is about 10 micro-inches, and about 4.5 micro-inches from 140-150 mm Because the edge of the ESC typically becomes hotter compared to the center of the ESC during processing, the edge is polished more than the center of the ESC. Polishing the surface of the ESC in such manner improves the contact between the surface of the ceramic body and the surface of the wafer, which enables better cooling of the wafer.

TABLE 1

Oxygen Ashing Results of Substrate Support Assembly

|  | C | N | O | F | Na | Mg | Al | Si | P |
|---|---|---|---|---|---|---|---|---|---|
| #1: 0 hrs | 39 | 8.7 | 30.6 | — | 0.1 | 0.1 | 15 | 4.9 | 0.4 |
| #2: 1 hrs | 8.5 | 9.7 | 46.3 | 3.3 | 0.4 | 0.5 | 25 | 3.8 | 1.1 |
| #7: 5 hrs | 8.1 | 7.9 | 47.2 | 4.3 | 0.8 | 0.9 | 26 | 2.5 | 0.6 |
| #10: 18 hrs | 6.6 | 6.6 | 50.2 | 4.6 | 0.2 | 1.4 | 26 | 3.1 | 0.6 |

|  | S | Cl | K | Ca | Zn | eBa/Co | Sm | N/Al |
|---|---|---|---|---|---|---|---|---|
| #1: 0 hrs | 0.3 | 0.2 | — | 0.2 | <0.1 | <0.1 | <0.1 | 0.57 |
| #2: 1 hrs | 0.2 | <0.1 | <0.1 | 0.4 | 0.2 | <0.1 | 0.3 | 0.38 |
| #7: 5 hrs | 0.2 | <0.1 | <0.1 | 0.8 | 0.3 | <0.1 | 0.3 | 0.3 |
| #10: 18 hrs | 0.1 | ? | — | 0.3 | <0.1 | <0.1 | 0.3 | 0.25 |

Table 1 shows oxygen ashing data for one embodiment of a substrate support assembly. As discussed above, contamination is introduced from the bonding (e.g., acrylic or silicone bonding) and the machining process of the ESC. Such contamination may be in the form of, but not limited to, carbon and silicon. Oxygen ashing, or stripping, is a process that may be used to remove contamination on the ceramic body. Such removal of contamination improves a thermal conductivity of the ESC. In an embodiment, oxygen ashing may be performed on the ceramic body after performing the bonding, wherein an atomic concentration of carbon on the upper surface of the ceramic body is less than 10 percent of the particles on the upper surface after performing the oxygen ashing.

Table 1 shows that the upper surface of the ceramic body has relatively high levels of carbon (C) and silicon (Si) contaminants immediately prior to performing oxygen ashing. For example, at 0 hours, the upper surface of the ceramic body has an atomic concentration of 39 percent of carbon and 4.9 percent of silicon, where the percentages are of the total particles on the upper surface. At one hour of oxygen ashing, the atomic concentration is reduced to 8.5 percent of carbon and 3.8 percent of silicon, respectively. At five hours of oxygen ashing, the level of contamination on the surface is reduced to approximately 8.1 percent, and at 18 hours of oxygen ashing, the contamination is reduced to approximately 6.6 percent. As shown, there are diminishing returns after about 1 hour of oxygen ashing. Accordingly, in one embodiment oxygen ashing is performed for approximately one hour. Performing oxygen ashing on the surface of the ceramic body removes contamination which helps to improve the temperature performance of the ESC.

Figure 8A:
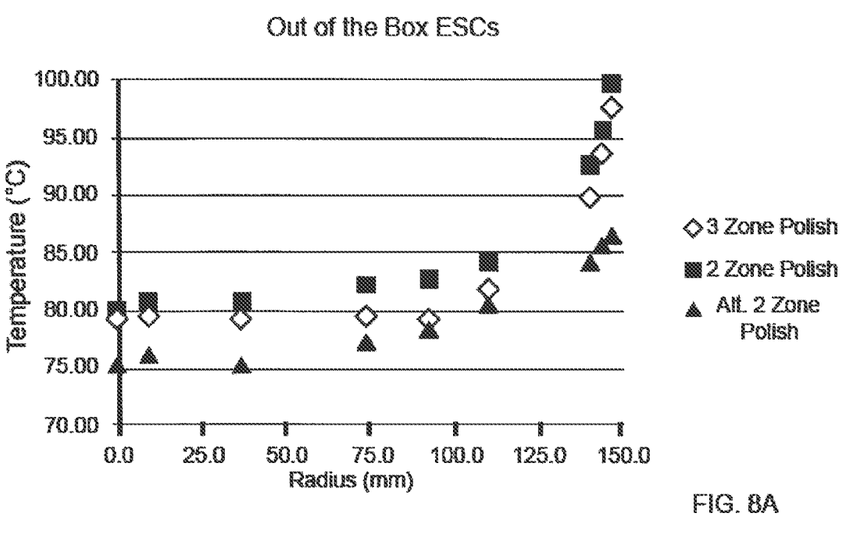
FIG. 8A illustrates temperature data for one embodiment of a substrate support assembly.

FIG. 8A illustrates temperature data for one embodiment of a substrate support assembly such as an ESC. The graph of FIG. 8A charts the temperature of a ceramic body of an ESC vs. the radial distance from the center of the ESC after executing a high power recipe or operating procedure on the ESC. FIG. 8A shows the temperature data for a new or unseasoned ESC without having been subjected to any or to little Radio Frequency Hours (RFHrs) of processing (e.g., little seasoning or cycling time of the ESC). The temperature data is shown for: 1) a 3 zone polished ESC; 2) a 2 zone polished ESC; and 3) an alternate 2 zone polished ESC. In an embodiment, the alternate 2 zone polished ESC may be polished using a polishing technique that is performed by NGK Corporation.

According to an embodiment of the present invention, the graph in FIG. 8A shows that multi-zone polished ESC has an improvement in the temperature management of the ESC. For example, the temperature of an ESC with a 2 zone and a 3 zone polish is about 80 degrees Celsius near the center of the ESC and about 100 degrees Celsius near the edge of the ESC. The temperature of an alternate 2 zone polished ESC is about 75 degrees near the center of the ESC and about 87 degrees near the edge of the ESC.

Figure 8B:
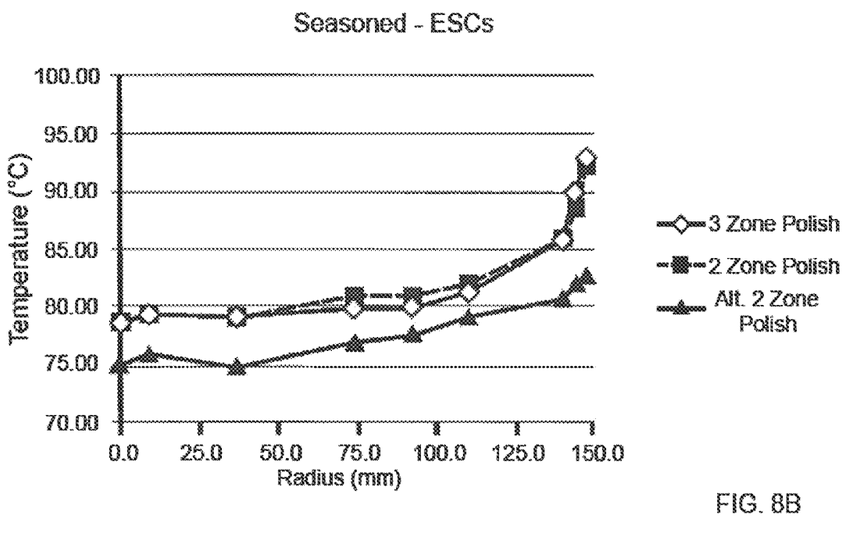
FIG. 8B illustrates temperature data for yet another embodiment of a substrate support assembly.

FIG. 8B illustrates temperature data for yet another embodiment of a substrate support assembly. The graph of FIG. 8B charts the temperature of a ceramic body of an ESC vs. the radial distance from the center of the ESC after executing a high power recipe or operating procedure on the ESC. FIG. 8B shows the temperature data for ESC after having been subjected to about 50 RFHrs of seasoning. The temperature data is shown for: 1) a 3 zone polished ESC; 2) a 2 zone polished ESC; and 3) an alternate 2 zone polished ESC.

According to an embodiment of the present invention, the graph in FIG. 8B shows that the ESC with about 50 RFHrs of processing shows additional improvements in the temperature management of the ESC. For example, the temperature of an ESC with a 2 zone and a 3 zone polish is about 78 degrees near the center of the ESC and about 92 degrees near the edge of the ESC, and the temperature of an alternate 2 zone polished ESC is about 75 degrees near the center of the ESC and about 83 degrees near the edge of the ESC.

The preceding description sets forth numerous specific details such as examples of specific systems, components, methods, and so forth, in order to provide a good understanding of several embodiments of the present invention. It will be apparent to one skilled in the art, however, that at least some embodiments of the present invention may be practiced without these specific details. In other instances, well-known components or methods are not described in detail or are presented in simple block diagram format in order to avoid unnecessarily obscuring the present invention. Thus, the specific details set forth are merely exemplary. Particular implementations may vary from these exemplary details and still be contemplated to be within the scope of the present invention.

Reference throughout this specification to "one embodiment" or "an embodiment" means that a particular feature, structure, or characteristic described in connection with the embodiment is included in at least one embodiment. Thus, the appearances of the phrase "in one embodiment" or "in an embodiment" in various places throughout this specification are not necessarily all referring to the same embodiment. In addition, the term "or" is intended to mean an inclusive "or" rather than an exclusive "or." When the term "about" or "approximately" is used herein, this is intended to mean that the nominal value presented is precise within ±10%.

Although the operations of the methods herein are shown and described in a particular order, the order of the operations of each method may be altered so that certain operations may be performed in an inverse order or so that certain operation may be performed, at least in part, concurrently with other operations. In another embodiment, instructions or sub-operations of distinct operations may be in an intermittent and/or alternating manner.

It is to be understood that the above description is intended to be illustrative, and not restrictive. Many other embodiments will be apparent to those of skill in the art upon reading and understanding the above description. The scope of the invention should, therefore, be determined with reference to the appended claims, along with the full scope of equivalents to which such claims are entitled.

What is claimed is:

1. An unseasoned substrate support assembly comprising:
   a ceramic body, an upper surface of the ceramic body comprising:
      a first portion proximate to a center of the ceramic body and having a first roughness profile, the first portion comprising a first plurality of mesas, wherein surfaces of the first plurality of mesas have a first roughness corresponding to the first roughness profile; and
      a second portion distal to the center of the ceramic body and having a second roughness profile, the second portion comprising an outer ring and a second plurality of mesas, wherein surfaces of the outer ring and the second plurality of mesas have a second roughness corresponding to the second roughness profile, the second roughness being a lower roughness than the first roughness;
      wherein areas of the first and second portions are based on radial distances from the center of the ceramic body; and
   a thermally conductive base bonded to a lower surface of the ceramic body.

2. The unseasoned substrate support assembly of claim 1, wherein the first roughness profile comprises an average roughness of approximately 10-16 micro-inches and the second roughness profile comprises an average roughness of less than 10 micro-inches.

3. The unseasoned substrate support assembly of claim 2, wherein the average roughness of approximately 10-16 micro-inches for the first portion and the average roughness of less than 10 micro-inches for the second portion cause a thermal gradient between the first portion and the second portion to be approximately 15 degrees C.

4. The unseasoned substrate support assembly of claim 1, wherein an atomic concentration of carbon on the upper surface of the ceramic body is less than 10 percent of particles on the upper surface.

5. The unseasoned substrate support assembly of claim 1, wherein the ceramic body comprises Aluminum Nitride (AlN) and wherein the thermally conductive base is bonded to the lower surface of the ceramic body by a silicone bond.

6. The unseasoned substrate support assembly of claim 1, wherein the unseasoned substrate support assembly is a substrate support assembly that has experienced less than 20 hours of processing after manufacture.

7. The unseasoned substrate support assembly of claim 1, the upper surface of the ceramic body further comprising:
   a third portion, between the first portion and the second portion, having a third roughness profile with a third roughness that is greater than the second roughness and lower than the first roughness, wherein an average roughness of the first roughness profile is about 13 micro-inches, an average roughness of the third roughness profile is about 10 micro-inches, and an average roughness of the second roughness profile is about 4.5 micro-inches, and wherein the first portion extends radially 0-75 mm from the center, the third portion extends radially 75-140 mm from the center, and the second portion extends radially 140-150 mm from the center.

8. The unseasoned substrate support assembly of claim 1, wherein the first portion extends radially approximately 0-140 mm from the center and the second portion extends radially approximately 140-150 mm from the center.

9. The unseasoned substrate support assembly of claim 1, wherein the second portion extends radially inward from an edge of the ceramic body by about 10 mm.

10. An electrostatic chuck having been manufactured by a manufacturing process comprising:
    providing a ceramic body;
    polishing an upper surface of the ceramic body to an average roughness of greater than 10 micro-inches, the upper surface comprising 1) a first portion that is proximate to a center of the upper surface of the ceramic body and comprises a first plurality of mesas that are polished to the average roughness of greater than 10 micro-inches and 2) a second portion that is distal to the center of the upper surface of the ceramic body and comprises an outer ring and a second plurality of mesas that are polished to the average roughness of greater than 10 micro-inches;
    polishing the second portion of the upper surface of the ceramic body without polishing the first portion of the upper surface of the ceramic body, wherein the second portion is polished to an average roughness of less than 10 micro-inches to cause the outer ring and the second plurality of mesas to have the average roughness of less than 10 micro-inches; and
    bonding a thermally conductive base to a lower surface of the ceramic body after polishing the second portion.

11. The electrostatic chuck of claim 10, wherein the first portion is polished to an average roughness of approximately 10-16 micro-inches.

12. The electrostatic chuck of claim 10, the manufacturing process further comprising:
    performing oxygen ashing on the ceramic body after performing the bonding, wherein an atomic concentration of carbon on the upper surface of the ceramic body is less than 10 percent of particles on the upper surface after performing the oxygen ashing.

13. The electrostatic chuck of claim 12, wherein the oxygen ashing is performed for a duration of one hour or greater.

14. The electrostatic chuck of claim 10, wherein:
    polishing the upper surface of the ceramic body comprises using a first polishing tool and a first slurry having a first grit; and
    polishing the second portion of the ceramic body comprises using a second polishing tool and a second slurry having a second grit that is finer than the first grit.

15. The electrostatic chuck of claim 10, further comprising:
    performing a first cleaning of the ceramic body after polishing the upper surface;
    performing a second cleaning of the ceramic body after polishing the second portion; and
    performing a third cleaning of the electrostatic chuck after the bonding.

16. A substrate support assembly comprising:
    a ceramic body, an upper surface of the ceramic body comprising:

a first portion proximate to a center of the ceramic body and having a first roughness profile comprising an average roughness of approximately 10-16 micro-inches, the first portion comprising a first plurality of mesas, wherein surfaces of the first plurality of mesas have a first roughness corresponding to the first roughness profile; and a second portion distal to the center of the ceramic body and having a second roughness profile comprising an average roughness of less than 10 micro-inches, the second portion comprising an outer ring and a second plurality of mesas, wherein surfaces of the outer ring and the second plurality of mesas have a second roughness corresponding to the second roughness profile;

wherein areas of the first and second portions are based on radial distances from the center of the ceramic body; and a thermally conductive base bonded to a lower surface of the ceramic body.

* * * * *